(12) United States Patent
Ogawa

(10) Patent No.: US 6,680,759 B2
(45) Date of Patent: Jan. 20, 2004

(54) ELECTRODE STRUCTURE OF DISPLAY PANEL AND ELECTRODE FORMING METHOD USING DUMMY ELECTRODE

(75) Inventor: Tetsuya Ogawa, Kawasaki (JP)

(73) Assignee: Fujitsu Hitachi Plasma Display Limited, Kawasaki (JP)

( * ) Notice: Subject to any disclaimer, the term of this patent is extended or adjusted under 35 U.S.C. 154(b) by 0 days.

(21) Appl. No.: 09/778,060

(22) Filed: Feb. 7, 2001

(65) Prior Publication Data
US 2001/0052958 A1 Dec. 20, 2001

(30) Foreign Application Priority Data
Jun. 14, 2000 (JP) .......................... 2000-178872

(51) Int. Cl.[7] .............................................. G02F 1/1343
(52) U.S. Cl. ...................... 349/54; 349/139; 349/152; 349/192
(58) Field of Search ..................... 349/149, 152, 349/54, 192, 139

(56) References Cited

U.S. PATENT DOCUMENTS 5,598,283 A * 1/1997 Fujii et al. .................. 349/143
5,757,450 A * 5/1998 Fujii et al. .................. 349/106
5,850,275 A * 12/1998 Watanabe et al. ........... 349/152
6,172,732 B1 * 1/2001 Hayakawa et al. .......... 349/152

FOREIGN PATENT DOCUMENTS

JP  10039322 A  *  2/1998  ......... G02F/1/1343

\* cited by examiner

Primary Examiner—Robert H. Kim
Assistant Examiner—Andrew Schechter
(74) Attorney, Agent, or Firm—Staas & Halsey LLP

(57) ABSTRACT

An electrode structure of a display panel includes a plurality of electrodes formed on a substrate constituting the display panel, the electrodes including display electrode portions provided in almost parallel in a central part of the substrate and oblique lead electrode portions converged in a predetermined number for each block from the display electrode portions to reach terminal portions at an end of the substrate, and a dummy electrode provided between two oblique lead electrode portions extending in different directions in a block boundary portion for limiting a flow of an etching solvent into the block boundary portion during etching when the electrodes are formed.

16 Claims, 16 Drawing Sheets

ELECTRODE STRUCTURE OF DISPLAY PANEL AND ELECTRODE FORMING METHOD USING DUMMY ELECTRODE

CROSS-REFERENCE TO RELATED APPLICATION

This application is related to Japanese Patent Application No. 2000-178872 filed on Jun. 14, 2000, whose priority is claimed under 35 USC §119, the disclosure of which is incorporated by reference in its entirety.

BACKGROUND OF THE INVENTION

1. Field of the Invention

The present invention relates to an electrode structure of a display panel and an electrode forming method, and more particularly, to an electrode structure of a display panel, for example, a plasma display panel (PDP), a liquid crystal display panel (LCD), an electro luminescence display (EL) or the like, in which electrodes are formed on a substrate through etching, and an electrode forming method.

2. Description of the Related Art

In a display panel of this kind, generally, electrodes are often formed through etching. In the case where the electrodes are to be formed on the substrate through etching, first, a layer of an electrode material such as ITO, $SnO_2$, Cr, Cu or Ag is uniformly formed over the whole surface of the substrate by evaporation, sputtering or printing such as slot coating, then a resist pattern having a geometry of the electrodes is formed on the electrode material layer by photolithography or the like, and the electrode material layer is etched by pouring an etching solvent like a shower over the resist pattern, i.e., by a so-called spray etching.

In recent years, particularly, a so-called conveyer type inline manufacturing system has been the mainstream of display panel manufacturing apparatus as mass production has been demanded. In the inline manufacturing system, processing is continuously carried out while delivering a panel substrate on a conveyer line. For this reason, the spray etching is also carried out by spraying the etching solvent sequentially onto substrates by a spray device provided in a fixed position while delivering the substrates through the conveyer line.

In the above-mentioned display panel, electrodes having a geometry as shown in FIG. 12 are formed on the substrate, for example. FIG. 12 shows an example of electrodes formed on a glass substrate on a front face side of a 3-electrode surface discharge type PDP. In this PDP, a plurality of pairs of electrodes X and Y for generating a main discharge (surface discharge) for display are provided in a horizontal direction on a central part (display region) of a substrate 11. These electrodes X and Y are divided into a plurality of blocks and are collected and converged for each block on ends of the substrate 11 (outside the display region).

In this example, the electrodes X are converged on one side of the substrate 11 (the left side in the figure) and the electrodes Y are converged on the other side of the substrate 11 (the right side in the figure). The electrodes X and Y are connected to flexible cables 34 at terminal portions 33 on a substrate end on said one side and on a substrate end on said other side, respectively, with use of an anisotropic conductive adhesive or the like and are connected to drivers.

In FIG. 12, for simplicity of description, eight display lines (a display line represented by a pair of electrodes X and Y) form one block (or group) and the electrodes X and Y of each block are converged on the terminal portions 33 on one side and on the other side. 12. In an actual display panel having 480 display lines, for example, the display lines are divided into four blocks, each block having 120 display lines, through the division of the display line depends upon the performance of drivers. In each of the blocks, 120 electrodes X and 120 electrodes Y are converged on the terminal portions 33 on one side and on the other side and are connected to the flexible cables 34 at the terminal portions 33, respectively.

In the above-mentioned display panel, as the size is increased and high definition is sought for, the width of electrodes is reduced. Consequently, the shape and the dimension of the electrodes obtained after etching are required to have higher precision and uniformity.

However, when the electrode material layer is etched by the spray etching method while delivering the substrate by means of the inline manufacturing system, the etching solvent is excessively supplied to a block boundary portion B of the resist pattern formed on the electrode material layer and the electrode material layer is over-etched in this portion. This problem is now described.

FIG. 13 is a view illustrating the details of an end of the substrate on which the electrodes X and Y are formed. Hereinafter, for convenience, rectilinear portions of the electrodes X and Y arranged in almost parallel in the display region of the substrate will be referred to as discharge electrode portions 51, and oblique portions of the electrodes X and Y which extend from the discharge electrode portions 51, converge in a predetermined number for each block and reach the terminal portions 33 at the end of substrate will be referred to as lead electrode portions 52.

As shown in FIG. 13, at the end of the substrate, the discharge electrode portions 51 of either X or Y electrodes of the electrode pairs alone (for example, only the Y electrodes) are led out by the lead electrode portions 52 and reach the terminal portions 33. Consequently, with regard to the Y electrodes, electrode distances between the electrodes are smaller in the terminal portions 33 than in the display region. In the block boundary portion B, however, since the lead electrode portions 52 of Y electrodes in adjacent blocks extend obliquely in such directions as to keep away from each other (i.e., in opposite directions) with the block boundary portion B interposed therebetween, the electrode distances are greater in the terminal portions 33 than in the display region. Furthermore, an electrode interval (a gap) between the electrodes X and Y of each electrode pair which acts as a discharge slit (discharge portion) is smaller than the electrode distances in the terminal portions, and an electrode interval (a gap) between the electrodes X and Y of adjacent electrode pairs which acts as an inverse slit (non-discharge portion) is greater than the electrode distances in the terminal portions. In other words, the electrode distances are little different in the central part of the substrate and are much greater in the block boundary portions at the end of the substrate. This difference in the electrode distances (i.e., in the density of the electrodes) at the end of the substrate causes a problem during etching.

FIG. 14 is a view illustrating the details of an end of the substrate on which the resist pattern for forming the above-described electrodes is provided. As shown in FIG. 14, when the resist pattern for the electrodes, that is, a resist pattern 51a for forming the discharge electrode portions, a resist pattern 52a for forming the lead electrode portions and a resist pattern 33a for forming the terminal portions, is provided and the spray etching is carried out while delivering the substrate 11 in a direction of an arrow K, a flow in a relative direction shown by an arrow F is generated in the etching solvent for the following reason.

FIG. 15 is a view illustrating a section taken along the line A–A' in FIG. 14. In general, the resist patterns 51*a*, 52*a* and 33*a* have hydrophobicity and has the property of repelling etching solvent 36. For this reason, the etching solvent 36 does not get on the resist patterns 51*a*, 52*a* and 33*a* easily and swells over the electrode material layer 31. Accordingly, the etching solvent 36 flows in the direction shown by the arrow F without getting over the resist patterns 51*a*, 52*a* and 33*a*.

In FIG. 14, attention will be paid to the block boundary portion B of the resist pattern. At the substrate end, the interval between terminal electrodes in the block boundary portion is larger than the interval between terminal electrodes which are not positioned in the block boundary portion, and has a larger area for receiving the etching solvent. Consequently, the inflow of the etching solvent into the block boundary portion B is larger. In the display region, however, the electrode interval in the block boundary portion B is equal to the electrode distances of other electrodes. Accordingly, when the etching solvent, flowing in the F direction at the substrate end, concentrates along the resist pattern 52*a* for forming the lead electrode portions and flows into the display region, the inflow of the etching solvent increases in the display region, so that a flow velocity is increased.

As shown in FIG. 15, therefore, an etching speed of a part of the electrode material layer 32 positioned in the block boundary portion B is larger than that of a part thereof which is not positioned in the block boundary portion B. As a result, the discharge electrode portions 51 of the electrodes (shown as shaded in FIG. 14) positioned in the block boundary portion B are over-etched as compared with the discharge electrode portions 51 of the electrodes which are not positioned in the block boundary portion B and thus have smaller widths.

FIG. 16 corresponds to FIG. 15, showing the shape of the electrodes after etching. As shown in FIG. 16, the discharge electrode portions 51 (shown as shaded in FIG. 16) of the electrodes positioned in the block boundary portion B are formed to be narrower than the discharge electrode portions 51 of the electrodes which are not positioned in the block boundary portion B. That will be a cause of uneven display on the finished display panel.

As shown in FIG. 13, furthermore, the electrodes to be conveyed (the Y electrodes in FIG. 13) are provided obliquely such that the electrodes of adjacent blocks keep away from each other in the block boundary portion B at the end of the substrate. Therefore, the interval between the adjacent electrodes in the block boundary portion B is larger than the electrode distances in other portions. Consequently, a coupling capacity between the electrodes having a larger electrode interval is different from that between the electrodes having smaller electrode distances. Thus, electrical characteristics also have nonuniformity.

SUMMARY OF THE INVENTION

In consideration of such circumstances, it is an object of the present invention to provide an electrode structure of a display panel in which a dummy electrode for limiting the flow of etching solvent is provided in a block boundary portion at a substrate end to prevent excessive etching of an electrode material layer positioned in the block boundary portion and after manufacture, the dummy electrode is utilized also for correction of nonuniform coupling capacity, thereby eliminating the nonuniformity of electrical characteristics which would otherwise be involved with the discontinuity in the intervals between terminals, and an electrode forming method.

The present invention provides an electrode structure of a display panel comprising a plurality of electrodes formed on a substrate constituting the display panel, the electrodes including display electrode portions provided in almost parallel in a central part of the substrate and oblique lead electrode portions converged in a predetermined number for each block from the display electrode portions to reach terminal portions at an end of the substrate, and a dummy electrode provided between two oblique lead electrode portions extending in different directions in a block boundary portion for limiting a flow of an etching solvent into the block boundary portion during etching when the electrode are formed.

According to the present invention, a fine electrode pattern can be fabricated more uniformly with high precision. Consequently, it is possible to prevent display unevenness in the block boundary portion. Moreover, in the case in which a coupling portion for coupling the dummy electrode and the lead electrode portion is provided, the coupling capacity of the electrodes is almost equal in all the electrodes. Therefore, it is possible to obtain a display panel having uniform electrical characteristics.

These objects as well as other objects, features and advantages of the present invention will become more apparent to those skilled in the art from the following description with reference to the accompanying drawings.

DESCRIPTION OF THE PREFERRED EMBODIMENTS

In the present invention, the substrate constituting the display panel may be a substrate of glass, quartz, ceramic or the like, on which a desired structure such as electrodes, an insulating film, a dielectric layer or a protective film may or may not be formed.

It is sufficient that the electrode is constituted by the display electrode portion and the lead electrode portion. The electrode may be formed of any known electrode material by any known process in the field without particular limitation. Examples of electrode materials include ITO, $SnO_2$, Ag, Au, Al, Cu, Cr, and their alloys and multilayered structures (for example, a Cr/Cu/Cr multilayered structure) and the like. As an electrode forming method, for example, an electrode material layer is uniformly formed on the substrate by a film formation technique such as evaporation or sputtering, a resist pattern having the geometry of the electrodes is formed on the electrode material layer by photolithography or the like, and the spray etching is carried out thereon. In the case in which electrodes having a different geometry is to be provided on the electrodes thus formed, the same steps are repeated. By such a forming method, it is possible to obtain a desired number of electrodes having a desired thickness and width at desired intervals.

It is sufficient that the dummy electrode is formed between two lead electrode portions which are converged in different directions in the block boundary portion. The dummy electrode is provided to restrain the etching solvent from flowing into the block boundary portion when etching is carried out during electrode formation. For simplicity of manufacture steps, it is desirable that the dummy electrode should be formed of the same material as that for the electrodes by the same formation method when the electrodes are formed.

In the above-mentioned structure, it is desirable that the dummy electrode should be an almost V-shape electrode which is formed along two lead electrode portions provided obliquely in different directions in the block boundary portion.

It is desirable that the dummy electrode should be wider than the electrodes. The dummy electrode may be constituted by a plurality of electrodes arranged in the direction of the flow of the etching solvent. In this case, the dummy electrodes may have different widths.

Figure 11:
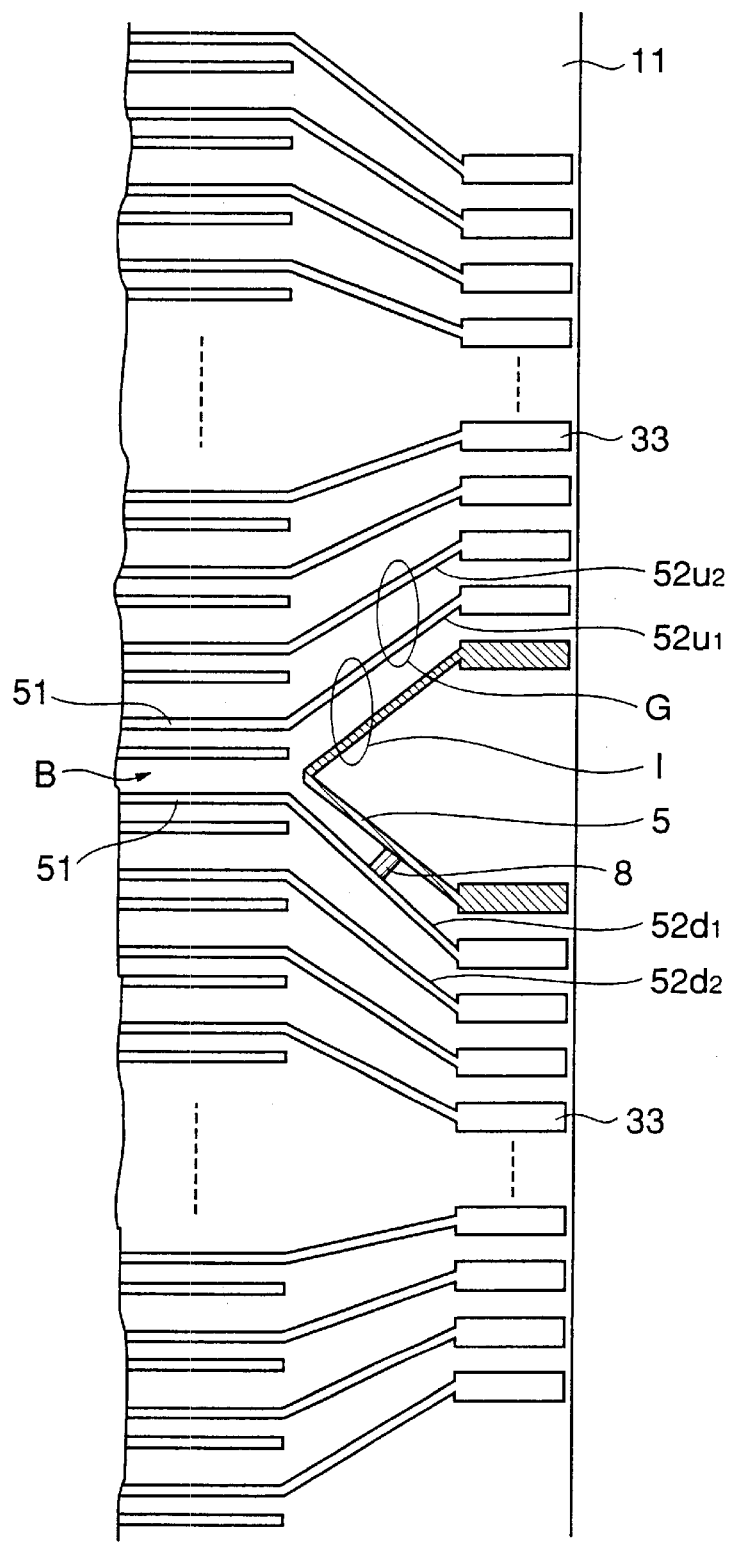
FIG. 11 is a view illustrating a state in which the coupling portion is formed according to the embodiment.

In order to make uniform the coupling capacity between the electrodes, it is desirable that a coupling portion 8 for coupling the dummy electrode to one of the lead electrode portions should further be formed on the same substrate as shown in FIG. 11. Consequently, a G portion and an I portion in FIG. 11 can have the same coupling capacity.

Moreover, the present invention provides a method of forming electrodes of a display panel comprising the steps of forming an electrode material layer on a substrate, forming a resist pattern for forming a plurality of display electrodes including display electrode portions arranged in almost parallel on a central part of the substrate and oblique lead electrode portions converged in a predetermined number for each block from the display electrode portions to reach terminal portions at an end of the substrate, simultaneously forming a resist pattern for limiting a flow of an etching solvent into a block boundary portion between traces of the resist pattern for forming the electrodes which traces correspond to two oblique lead electrode portions extending in different directions in the block boundary portion, and the carrying out etching to form the electrodes.

In this electrode forming method, it is desirable that the resist pattern for limiting the flow of the etching solvent should have an almost V-shape pattern formed along traces of the resist pattern for forming the two lead electrodes extending obliquely in different directions in the block boundary portion.

It is desirable that the resist pattern for limiting the flow of the etching solvent should be wider than the resist pattern for forming the electrodes. Furthermore, the resist pattern for limiting the flow of the etching solvent may be constituted by a plurality of resist patterns arranged in the direction of the flow of the etching solvent. In this case, the resist patterns for limiting the flow of the etching solvent may have different widths, respectively.

Embodiment of the present invention will be described below with reference to the drawings and the present invention is not restricted thereto.

First of all, the construction of a display panel having an electrode structure according to the present invention will be described by taking a PDP shown in FIG. 1 as an example.

Figure 1:
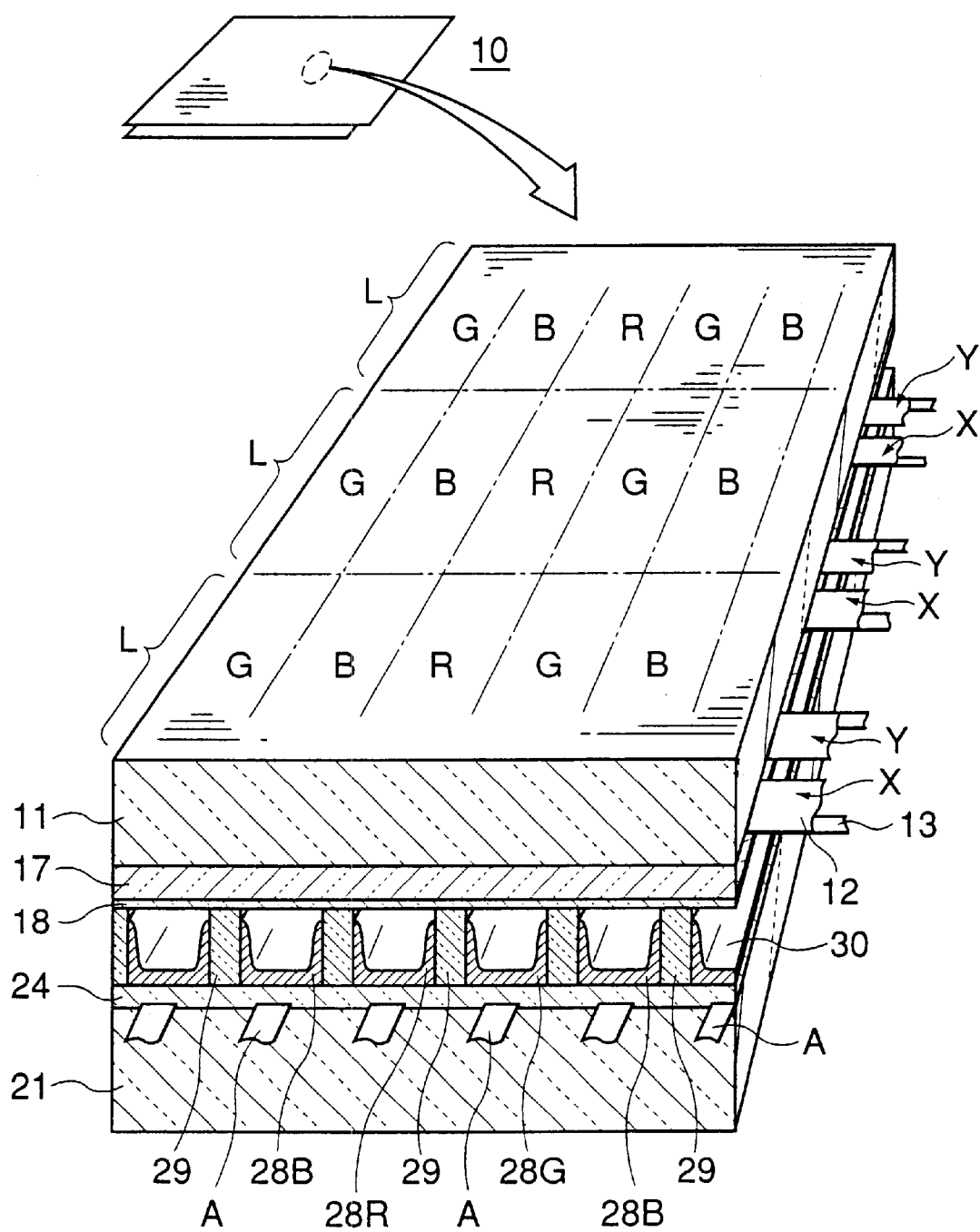
FIG. 1 is a perspective view partially showing a general AC type 3-electrode surface discharge PDP.

FIG. 1 is a perspective view partially showing a general AC type 3-electrode surface discharge PDP. The structure shown in FIG. 1 is an example, to which the present invention is not restricted. The present invention can apply to any display panel having electrodes formed on a panel substrate by etching.

A PDP 10 is constituted by a panel assembly on a front face side and a panel assembly on a back face side.

The panel assembly on the front face side has such a structure that a pair of stripe-shaped display (sustain) electrodes X and Y are formed in parallel in a transverse direction for each display line L on a substrate 11 on the front face side, a dielectric layer 17 is formed to cover the display electrodes X and Y and a protective film 18 is formed on the dielectric layer 17.

The substrate 11 on the front face side is usually formed of a glass substrate but may be formed of a quartz glass substrate or the like.

The display electrodes X and Y have an electrode structure of a display panel according to the present invention which will be described below and are formed by an electrode forming method according to the present invention.

The dielectric layer 17 is formed of a material which is usually used for PDPs. More specifically, the dielectric layer 17 can be formed by applying a paste including a low-melting-point glass powder and a binder to the substrate through screen printing and burning it.

The protective film 18 is provided to protect the dielectric layer 17 from damage caused by ion collision generated through discharge during display. The protective film 18 is formed of MgO, CaO, SrO, BaO or the like, for example.

In general, the panel assembly on the back face side has such a structure that a plurality of stripe-shaped address (data) electrodes A are formed in parallel in a vertical direction on a substrate 21 on the back face side, a dielectric layer 24 is formed to cover the address electrodes A, a plurality of stripe-shaped barrier ribs 29 for partitioning a discharge space are formed in parallel on the dielectric layer 24 between the address electrodes A, and stripe-shaped fluorescent layers 28R, 28G and 28B are formed on bottom faces and side faces in trenches between the barrier ribs 29.

The substrate 21 on the back face side can be constructed of a substrate of the same type as the substrate 11 on the front face side. The dielectric layer 24 can be formed of a material of the same type as used for the dielectric layer 17 provided on the substrate 11 on the front face side.

The address electrodes A also have the electrode structure of the display panel according to the present invention as the display electrodes X and Y, and furthermore, are formed by the electrode forming method according to the present invention.

The barrier ribs 29 can be formed by sand blasting, printing, photoetching or the like. For example, after a paste including a low-melting-point glass powder and a binder is applied onto the dielectric layer 24 and is then burned, the resulting paste is cut by sand blasting to form the barrier ribs 29. Alternatively, a photosensitive resin is used as the binder, and the paste is exposed and developed using a mask and then burned. Thus, the barrier ribs 29 can be formed.

The fluorescent layers 28R, 28G and 28B can be formed by applying a fluorescent paste including a fluorescent powder and a binder into trenches between the barrier ribs 29 by using screen printing, a dispenser or the like and repeating this operation for each color, followed by burning. Thus, the fluorescent layers 28R, 28G and 28B can be formed. Alternatively, the fluorescent layers 28R, 28G and 28B can be formed by using sheet-form fluorescent layer materials (so-called green sheets) including fluorescent powders and binders through photolithography. In this case, a sheet having a desired color is stuck to the whole display region on the substrate, and is exposed and developed. This operation is repeated for each color so that the fluorescent layers of the respective colors can be formed between the corresponding barrier ribs.

The PDP 10 is fabricated by opposing the panel assembly on the front face side to the panel assembly on the back face side such that the display electrodes X and Y and the address electrode A are orthogonal to each other, sealing the peripheries of the panel assemblies, and filling a space partitioned by the barrier ribs 29 with a discharge gas such as neon or xenon. In the PDP 10, a discharge space at a cross position of the display electrodes X and Y with the address electrode A acts as one cell region (unit light emitting region) which is a minimum unit of display.

As described above, the display electrodes X and Y as well as the address electrodes A have the electrode structure of the display panel according to the present invention, and furthermore, are formed by the electrode forming method according to the present invention. This will be described below.

Figure 12:
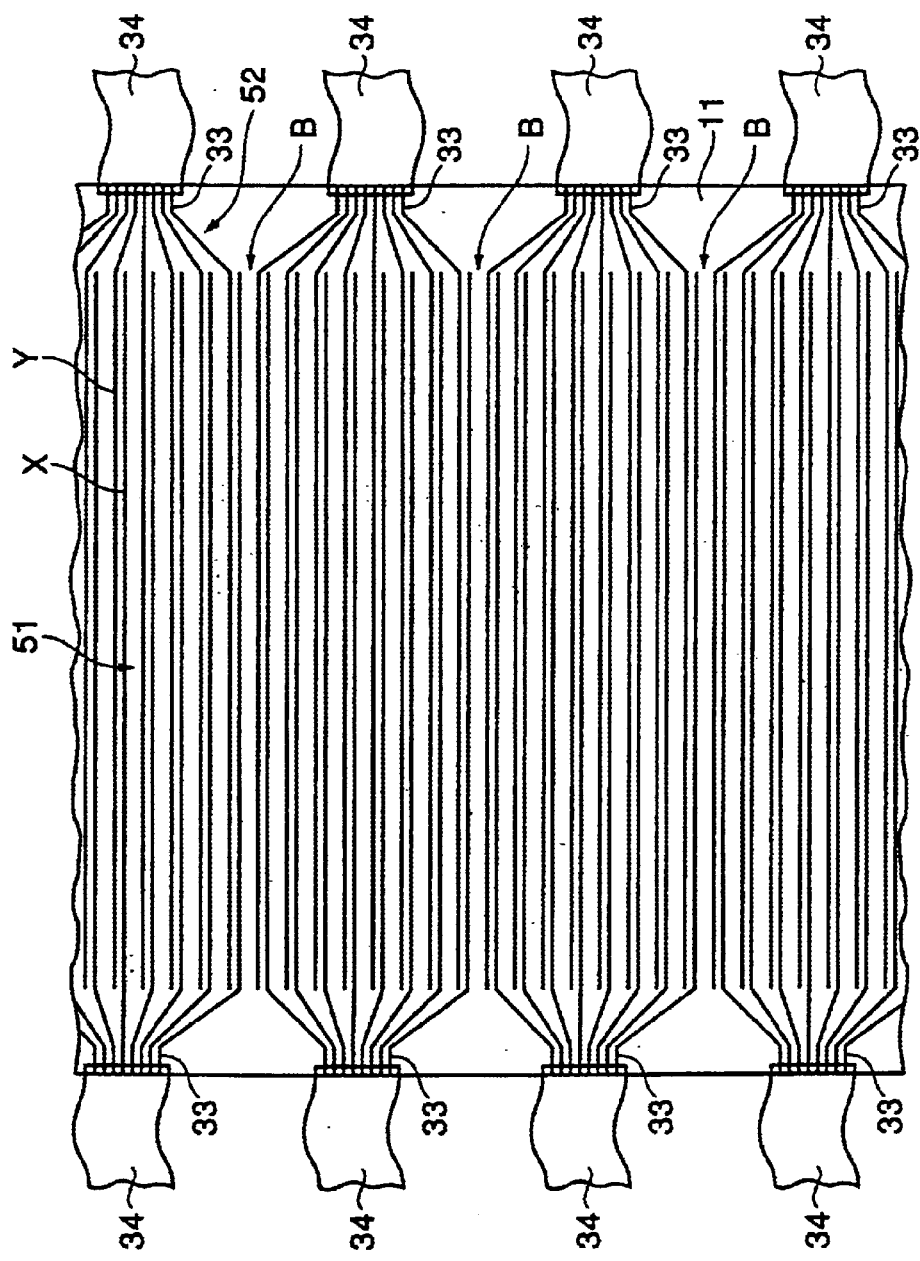
FIG. 12 is a view illustrating a conventional electrode structure of a display panel wherein electrodes are formed on a panel substrate.
Figure 13:
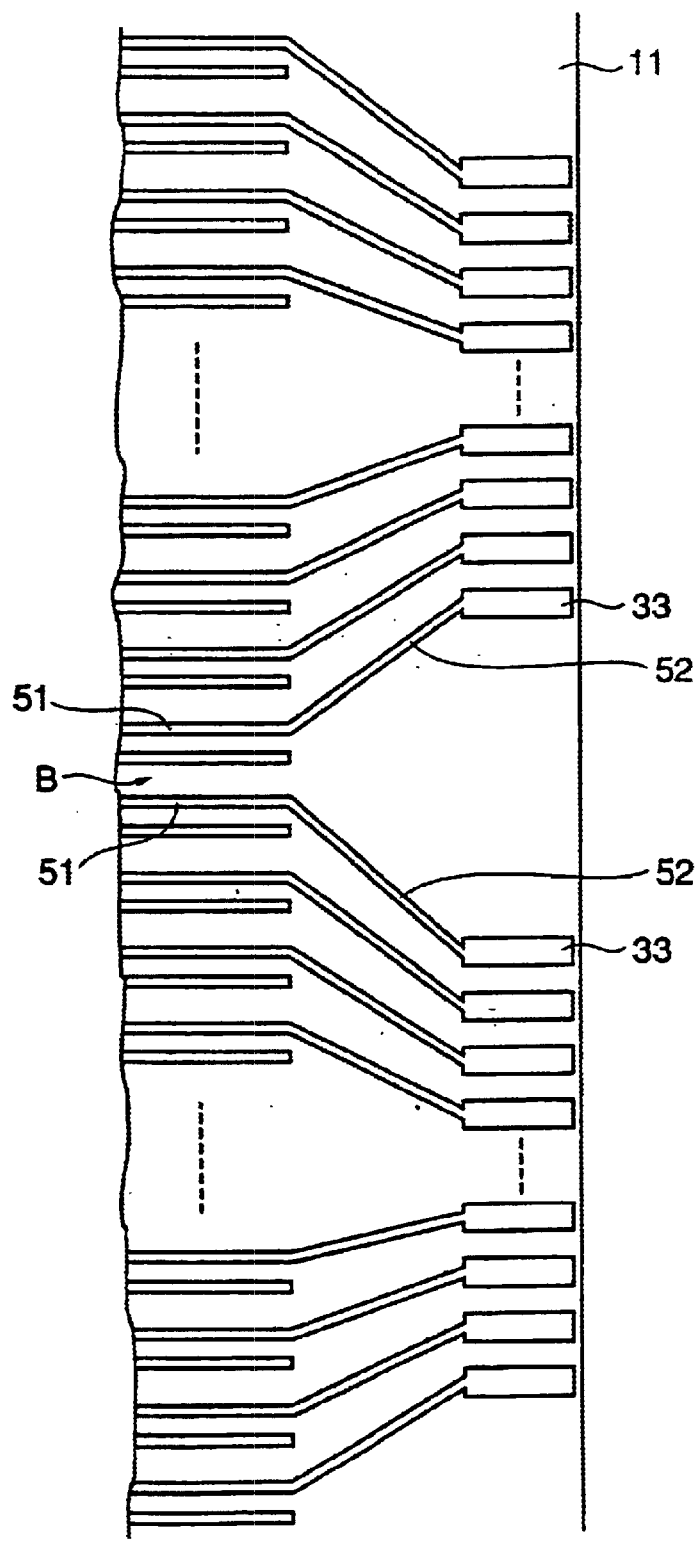
FIG. 13 is a view illustrating the details of an end of a substrate on which X and Y electrodes are formed according to the conventional art.

As shown in FIG. 12, a large number of display electrodes X and Y making pairs for generating a main discharge (surface discharge) for display are provided in a horizontal direction on a central part (display region) of the substrate 11. The display electrodes X and Y are divided into a plurality of blocks and are collected and converged for each block at ends of the substrate 11 (outside the display region).

The display electrodes X and Y are connected to flexible cables with an anisotropic conductive adhesive or the like at terminal portions led to the substrate ends on opposite sides and are then connected to their respective drivers.

More specifically, the PDP 10 is a display panel having 480 display lines. The display lines are divided into four blocks, each block having 120 display lines. 120 display electrodes X and 120 display electrodes Y in each block are converged in the terminal portions on one side and on the other side respectively, and are connected to the flexible cables. That is, the display electrodes X divided into four blocks are connected to the flexible cables at four positions of one side, and so are the display electrodes Y on the other side.

More specifically, the display electrodes X and Y are constituted by rectilinear discharge electrode portions (display electrode portions) provided in almost parallel in the display region of the substrate and oblique lead electrode portions converged in a predetermined number for each block from the discharge electrode portions and reaching terminal portions at ends of the substrate on the opposite sides.

The display electrodes X and Y are each constituted by a transparent electrode 12 such as ITO or $SnO_2$ and a metallic bus electrode 13 such as Ag, Au, Al, Cu, Cr or their multilayered structure (for example, a Cr/Cu/Cr multilayered structure) to reduce the resistance of the electrode.

The display electrodes X and Y are formed by etching. More specifically, an electrode material layer for the transparent electrodes such as ITO or $SnO_2$ is uniformly formed over the substrate 11 by a film formation technique such as evaporation or sputtering, a resist pattern having the geometry of the electrodes is formed on the electrode material layer by photolithography or the like, and spray etching is carried out from above the resist pattern. Thus, the transparent electrodes 12 are formed. The same steps are repeated by using an electrode material for the bus electrodes 13. Consequently, the bus electrodes 13 are formed. The bus electrodes 13 are formed with such a length as to reach the terminal portions on the substrate ends, while the transparent electrodes 12 are formed with such a length as to stop in the middle of the lead electrode portions. In other words, the terminal portions are formed only of the bus electrodes. Thus, the display electrodes X and Y are formed in a desired number to a desired thickness and width at desired intervals.

The PDP 10 is manufactured by using an inline manufacturing system. The display electrodes X and Y are subjected to spray etching. Accordingly, the spray etching is carried out by sequentially spraying etching solvent onto substrates 11 by means of a spray device (not shown) provided in a fired position while delivering the substrates 11 on a conveyer line.

The address electrodes A are constituted by Ag, Au, Al, Cu, Cr, their laminated structure (for example, a Cr/Cu/Cr multilayered structure) or the like, for example. The address electrodes A are also formed in a desirable number to a desired thickness and width at desired intervals by a combination of a film formation technique such as evaporation or sputtering, photolithography and spray etching in the same manner as the electrodes X and Y. The terminal portions of the address electrodes may be alternatively led to substrate ends on opposite sides or may be led together to a substrate end on one side. Usually the former is employed.

The detailed electrode structure of the display electrodes X and Y and the address electrodes A and the electrode forming method using the spray etching will be described below.

Figure 2:
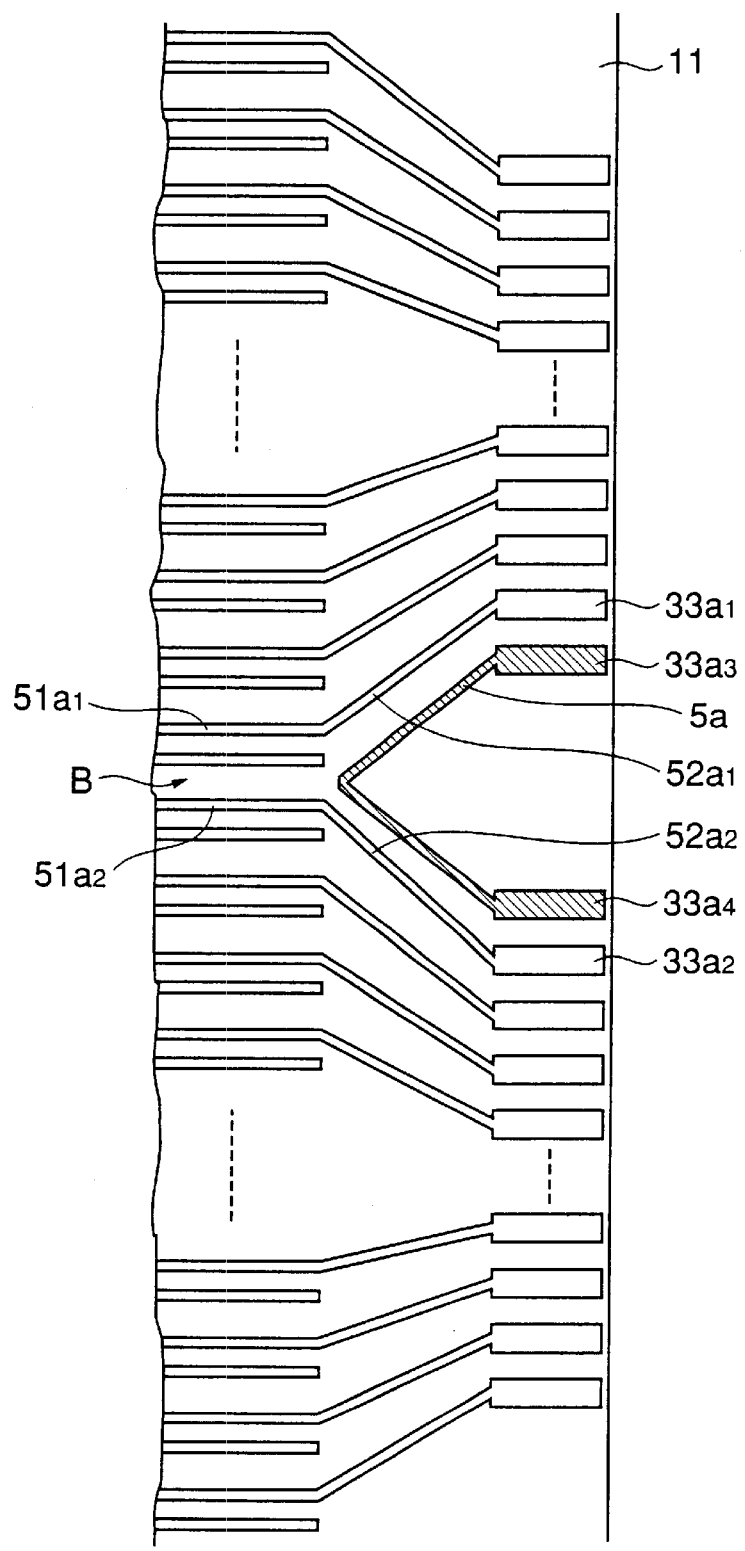
FIG. 2 is a view illustrating an electrode structure of a display panel and an electrode forming method according to an embodiment of the present invention.
Figure 14:
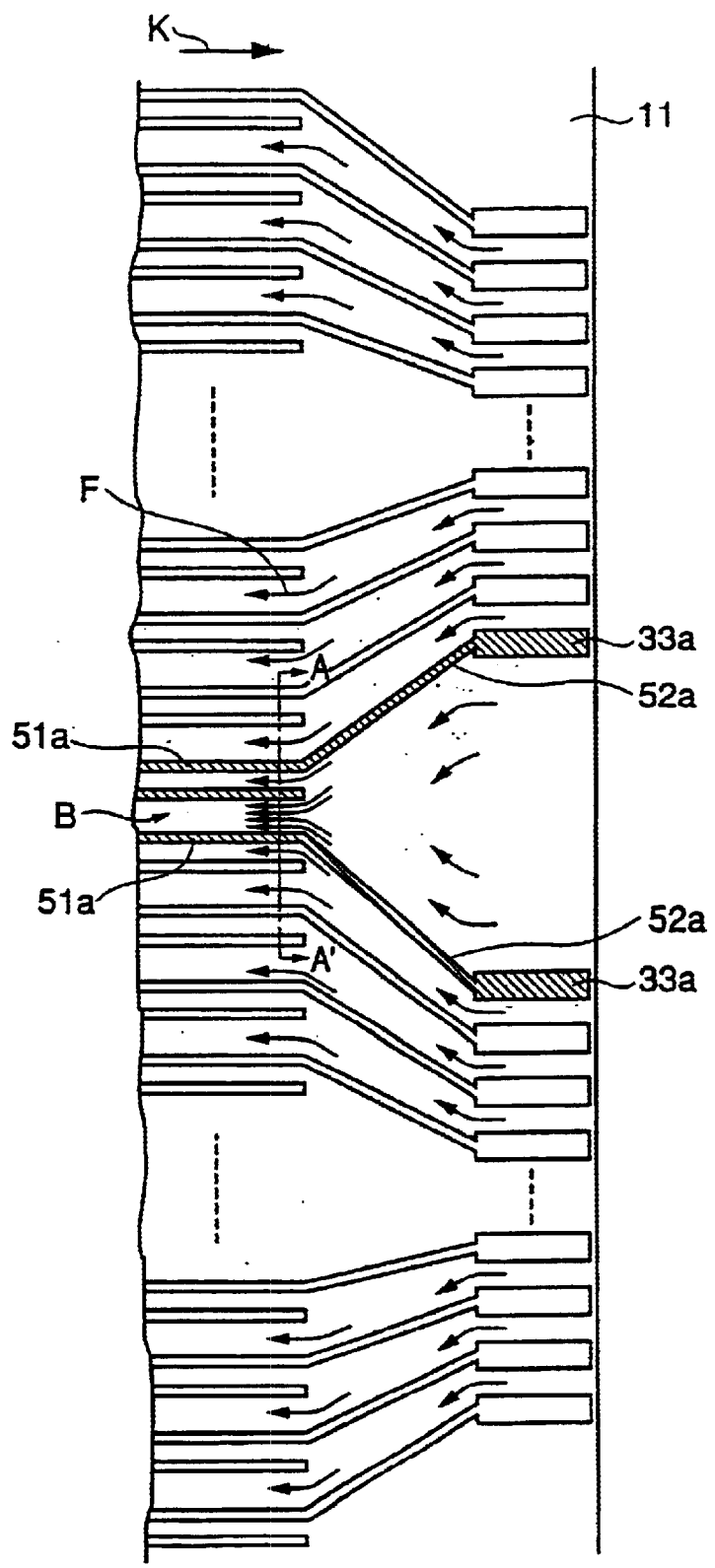
FIG. 14 is a view illustrating the details of an end of the substrate on which a resist pattern for electrode formation is provided according to the conventional art.
Figure 15:
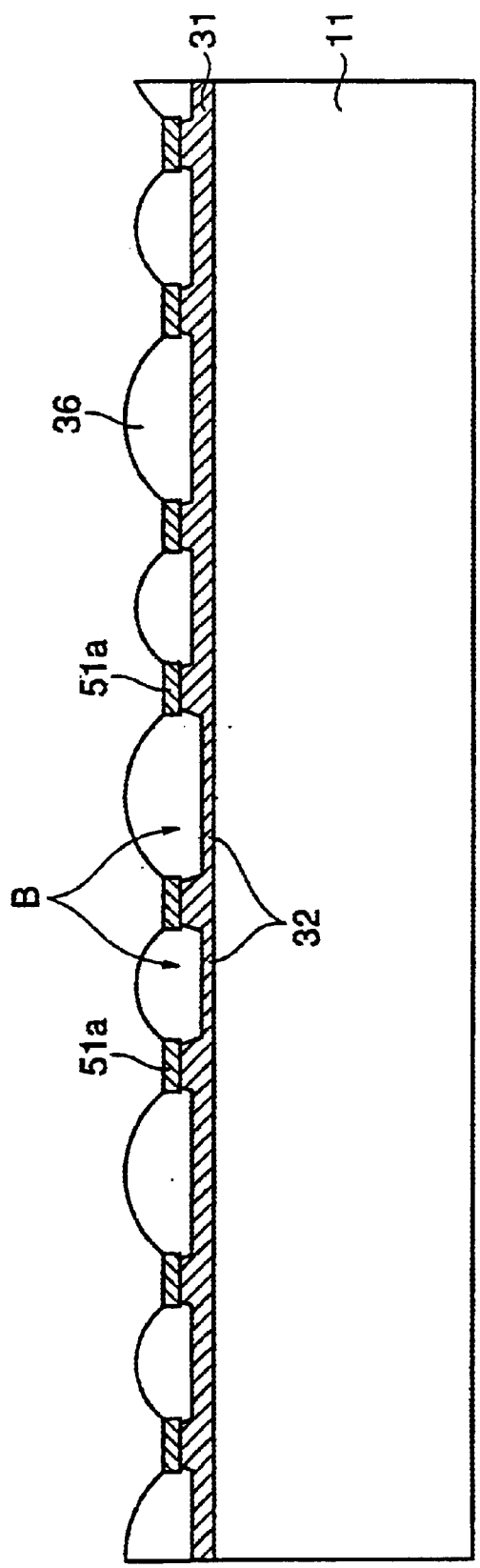
FIG. 15 is a view illustrating a section taken along the line A–A' in FIG. 14.
Figure 16:
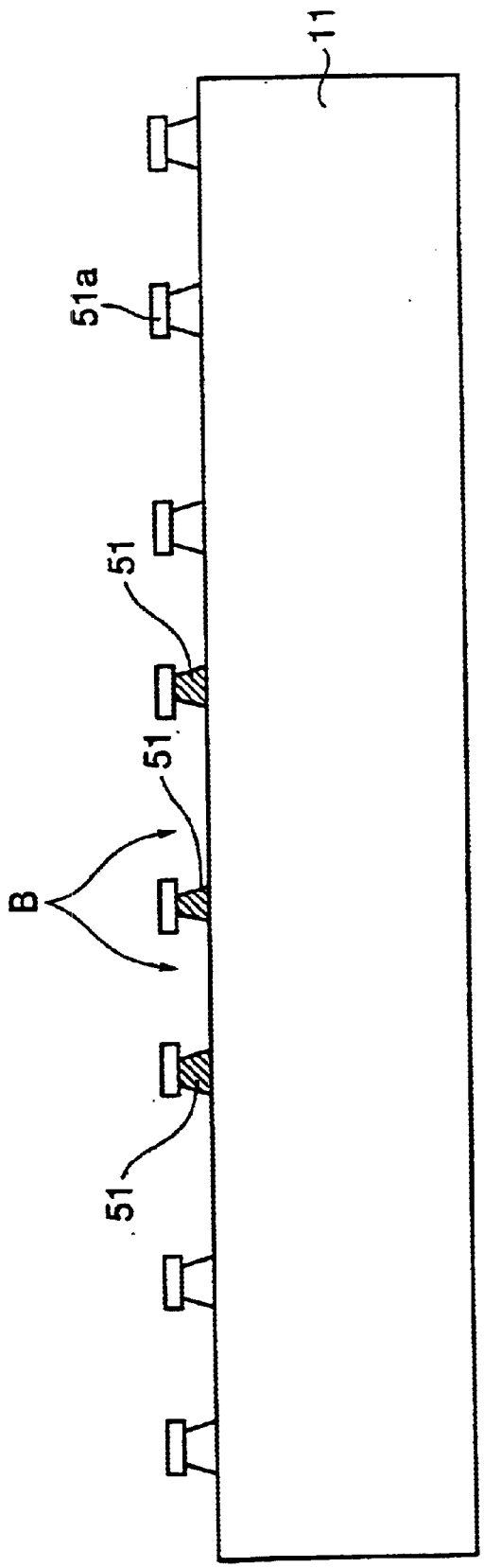
FIG. 16 is a view corresponding to FIG. 15, showing the shape of electrodes after etching according to the conventional art.

FIG. 2 is a view illustrating an electrode structure of a display panel and an electrode forming method according to an embodiment of the present invention. FIG. 2 illustrates the details of an end of a substrate on which a resist pattern for forming the bus electrodes of the display electrodes X and Y is provided, and corresponds to FIG. 14 showing a conventional structure. Transparent electrodes are not shown.

In FIG. 2, B denotes a block boundary portion, $51a_1$ and $51a_2$ denote a resist pattern for forming discharge electrode portions of X and Y electrodes, $52a_1$ and $52a_2$ denote a resist pattern for forming lead electrode portions of the Y electrodes, $33a_1$ and $33a_2$ denote a resist pattern for forming terminal portions of the Y electrodes, and $5a$ denotes a resist pattern for dummy electrode formation (shown as shaded in FIG. 2). The resist pattern $5a$ for dummy electrode formation includes traces $33a_3$ and $33a_4$ for terminal portions. The dummy electrode is formed to extend up to the positions of the terminal portions.

A trace $52a_1$ of the resist pattern for forming a lead electrode portion of one block and a trace $52a_2$ of the resist pattern for forming a lead electrode portion of the other block are parted in two directions from the block boundary portion B, and are extended to the traces $33a_1$ and $33a_2$ for forming different terminal portions.

As shown in FIG. 2, in the present embodiment, when the resist pattern is formed on the electrode material layer, the resist pattern $5a$ for dummy electrode formation, which is not directly related to an image display operation of the PDP, is formed to limit the etching solvent flowing into the block boundary portion B.

The resist pattern $5a$ for dummy electrode formation is positioned in the block boundary portion B and is almost V-shaped in parallel with the trace $52a_1$ of the resist pattern for forming the lead electrode portion and the trace $52a_2$ of the resist pattern for forming the lead electrode portion. The resist pattern $5a$ has almost the same pattern width and pattern interval as those of the resist pattern of the adjacent electrodes.

Figure 3:
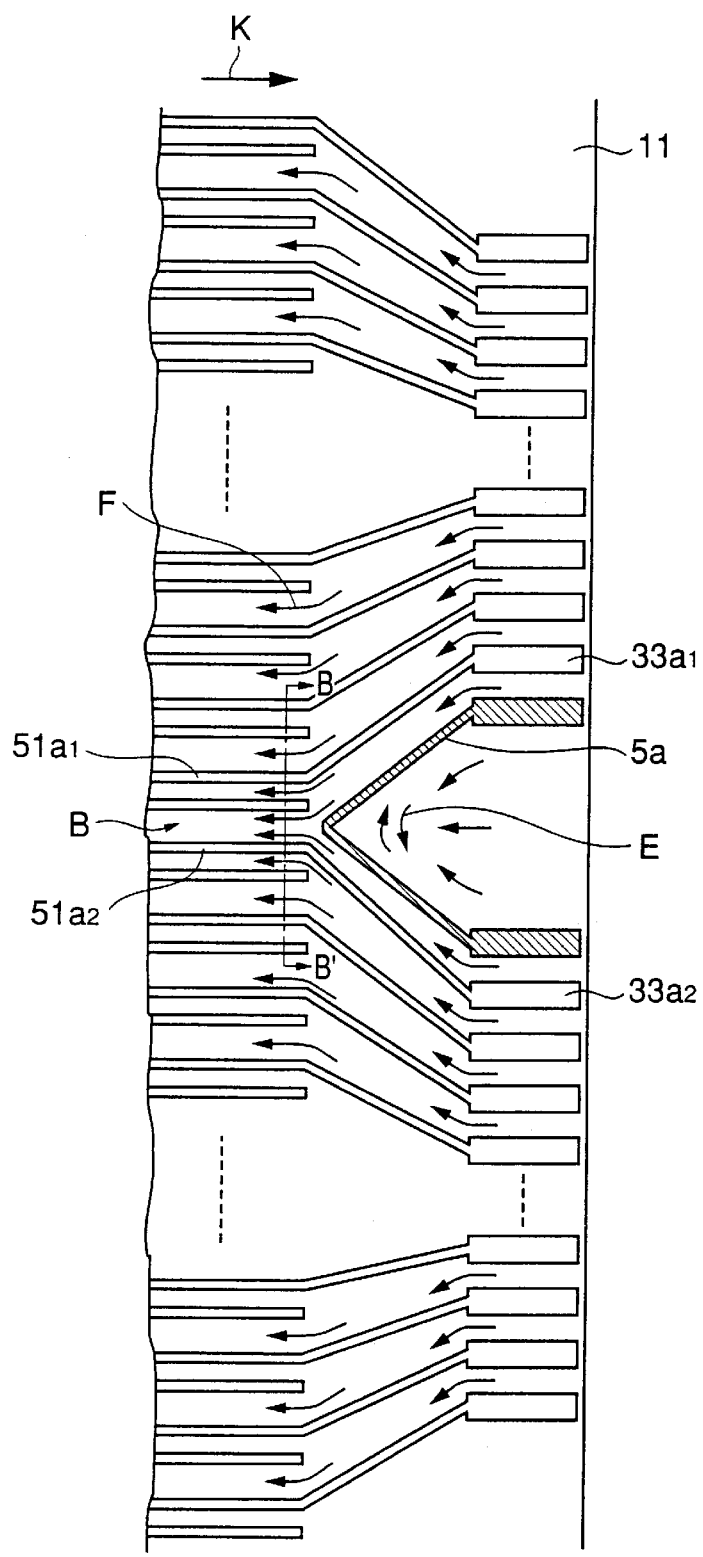
FIG. 3 is a view illustrating a flow of etching solvent according to the embodiment.

Since the resist pattern $5a$ for dummy electrode formation is provided, excessive supply of the etching solvent to the block boundary portion B is inhibited (ad indicated by an arrow E in FIG. 3) even if the spray etching is carried out while delivering the substrate 11 in the direction of an arrow K shown in FIG. 3. Therefore, the flow rate of the etching solvent (flowing in the direction of an arrow F in FIG. 3) is not increased in the block boundary portion B and becomes wholly uniform.

Figure 4:
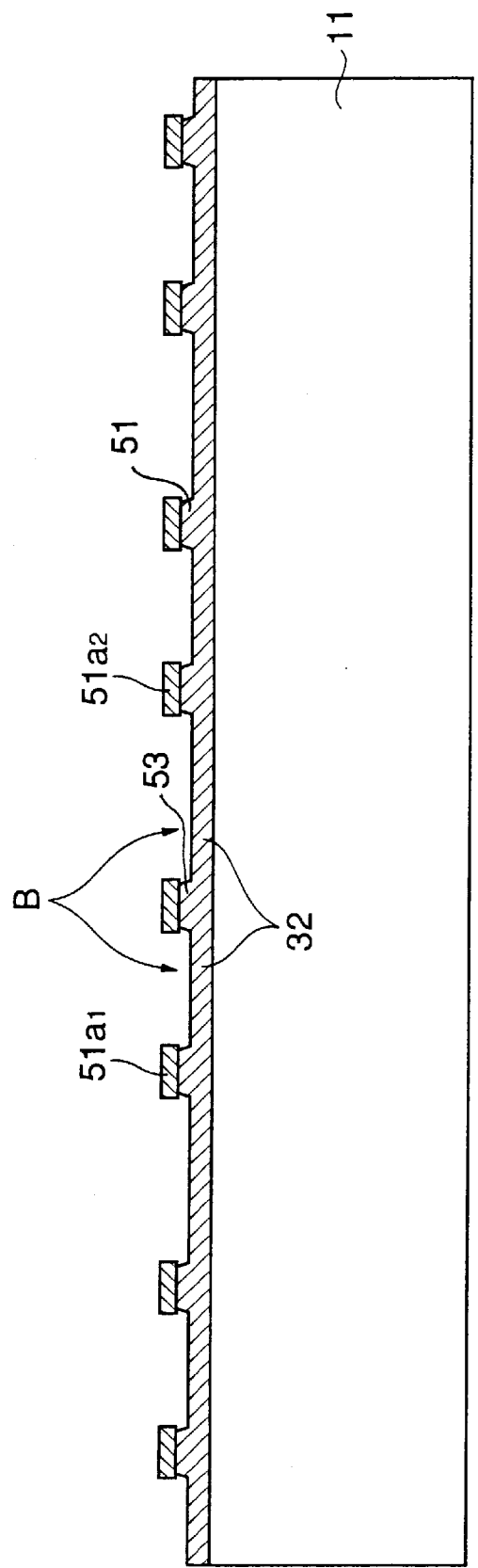
FIG. 4 is a view illustrating a section taken along the line B–B' in FIG. 3.

FIG. 4 is a view illustrating a section taken along the line B–B' in FIG. 3. As described above, the flow of the etching solvent is wholly uniform. Consequently, the etching speed of an electrode material layer 32 positioned in the block boundary portion B is almost equal to that in the other portions. Thus, the electrode material layer 32 positioned in the block boundary portion B can be prevented from being etched excessively. As a result, the width of a discharge electrode portion 53 in the electrode positioned in the block boundary portion B is almost equal to that of a discharge electrode portion 51 of an electrode which is not positioned in the block boundary portion B.

Figure 5:
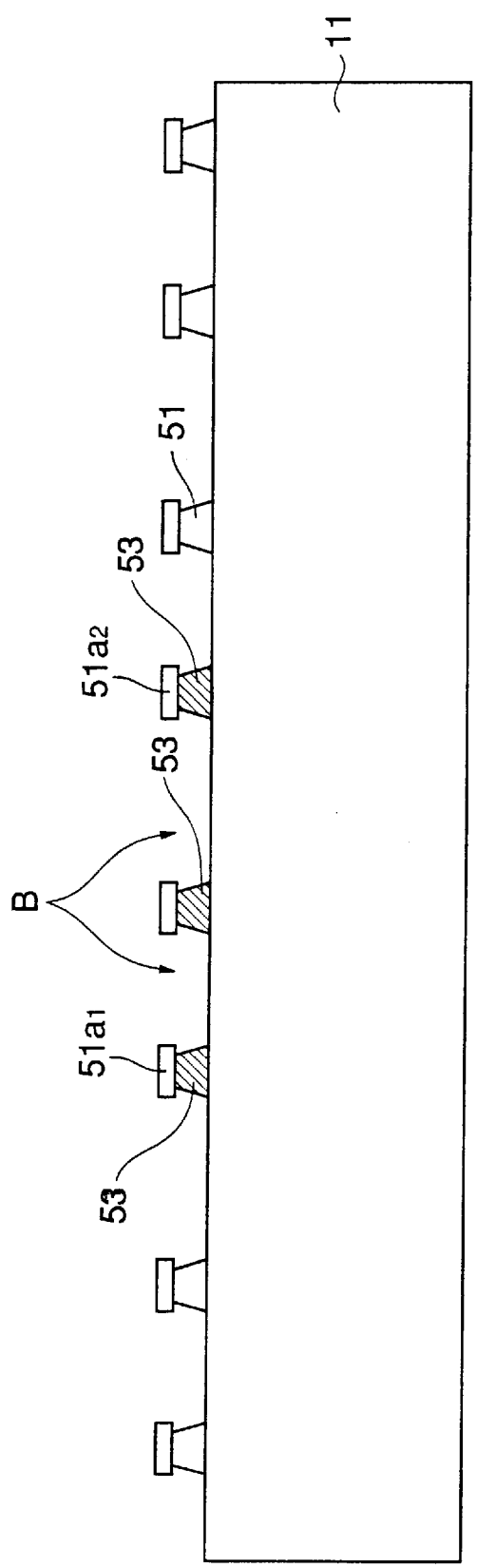
FIG. 5 is a view corresponding to FIG. 4 showing the shape of electrodes after etching according to the embodiment.

FIG. 5 corresponds to FIG. 4 showing the shape of the electrodes which are obtained after the etching. As shown in FIG. 5, the discharge electrode portions 53 (shown as shaded in FIG. 5) of the X and Y electrodes positioned in the block boundary portion B have width almost equal to that of the discharge electrode portions 51 of the X and Y electrodes which are not positioned in the block boundary portion B.

Thus, the resist pattern $5a$ for dummy electrode formation provided during the formation of the electrodes can prevent the electrode material layer positioned in the block boundary portion B from being excessively etched. Thus, electrodes having a uniform dimension can be formed, so that display unevenness in the direction of the electrodes can be prevented from being generated on the finished display panel.

Although the resist pattern $5a$ for dummy electrode formation has been formed with almost the same pattern width as that of the resist pattern for the adjacent electrodes in the above example, the pattern width may be greater than that of the resist pattern for the other electrodes. In this case, the etching solvent gets over the resist pattern $5a$ for dummy electrode formation with more difficulty.

Figure 6:
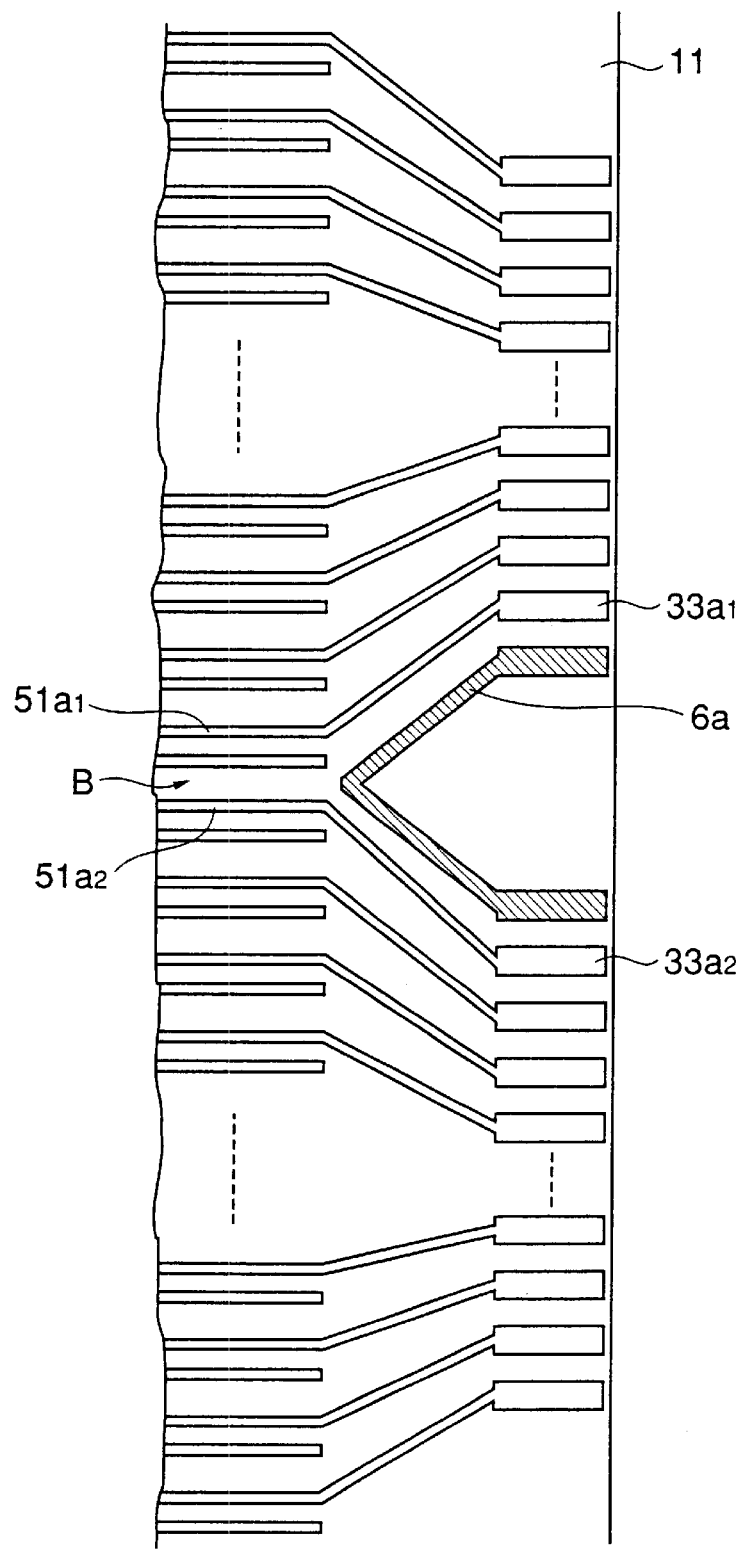
FIG. 6 is a view illustrating a first variant of a resist pattern for forming a dummy electrode according to the embodiment.

FIG. 6 is a view illustrating a first variant of the resist pattern for dummy electrode formation.

In the present example, a resist pattern $6a$ for dummy electrode formation having a greater width than that of the resist pattern for the other electrodes is provided to enhance effects. Thus, the increase in the width of the resist pattern $6a$ for dummy electrode formation can make the flow of the etching solvent more uniform.

Figure 7:
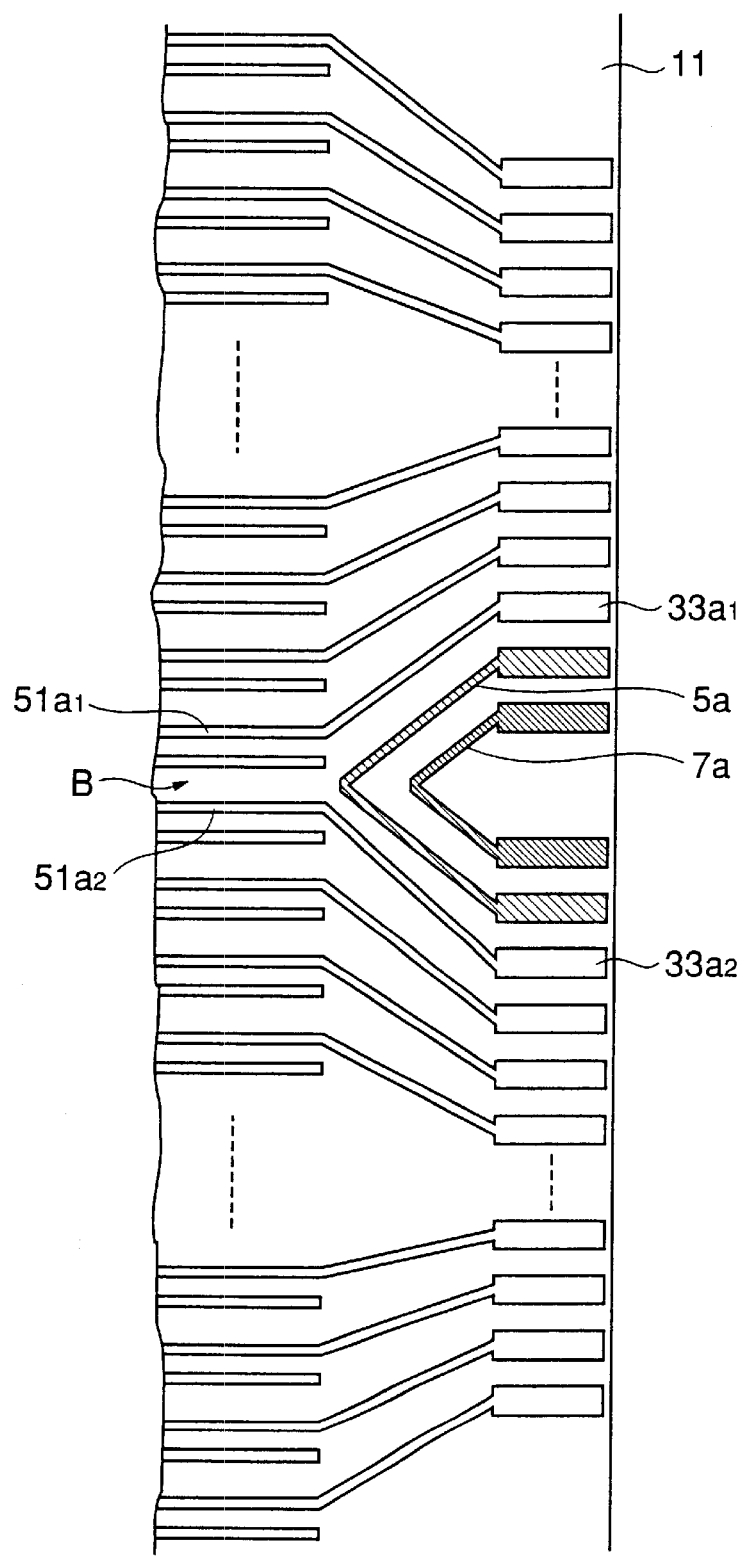
FIG. 7 is a view illustrating a second variant of the resist pattern for forming a dummy electrode according to the embodiment.

FIG. 7 is a view illustrating a second variant of a resist pattern for dummy electrode formation.

In the present example, two resist patterns for dummy electrode formation are arranged in a direction of the flow of the etching solvent in order to enhance effects more. In other words, a resist pattern $5a$ for dummy electrode formation and a resist pattern $7a$ for dummy electrode formation are provided. The resist patterns $5a$ and $7a$ for dummy electrode formation are formed with the same widths as those of the resist pattern for other electrodes. Thus, the flow of the etching solvent can be made more uniform by an increase in the number of the resist patterns for dummy electrode formation.

Although the two resist patterns for dummy electrode formation are provided in the above-described example, three or more resist patterns may be formed if necessary. Moreover, the width of the resist patterns for dummy electrode formation may also be varied properly if necessary.

Figure 8:
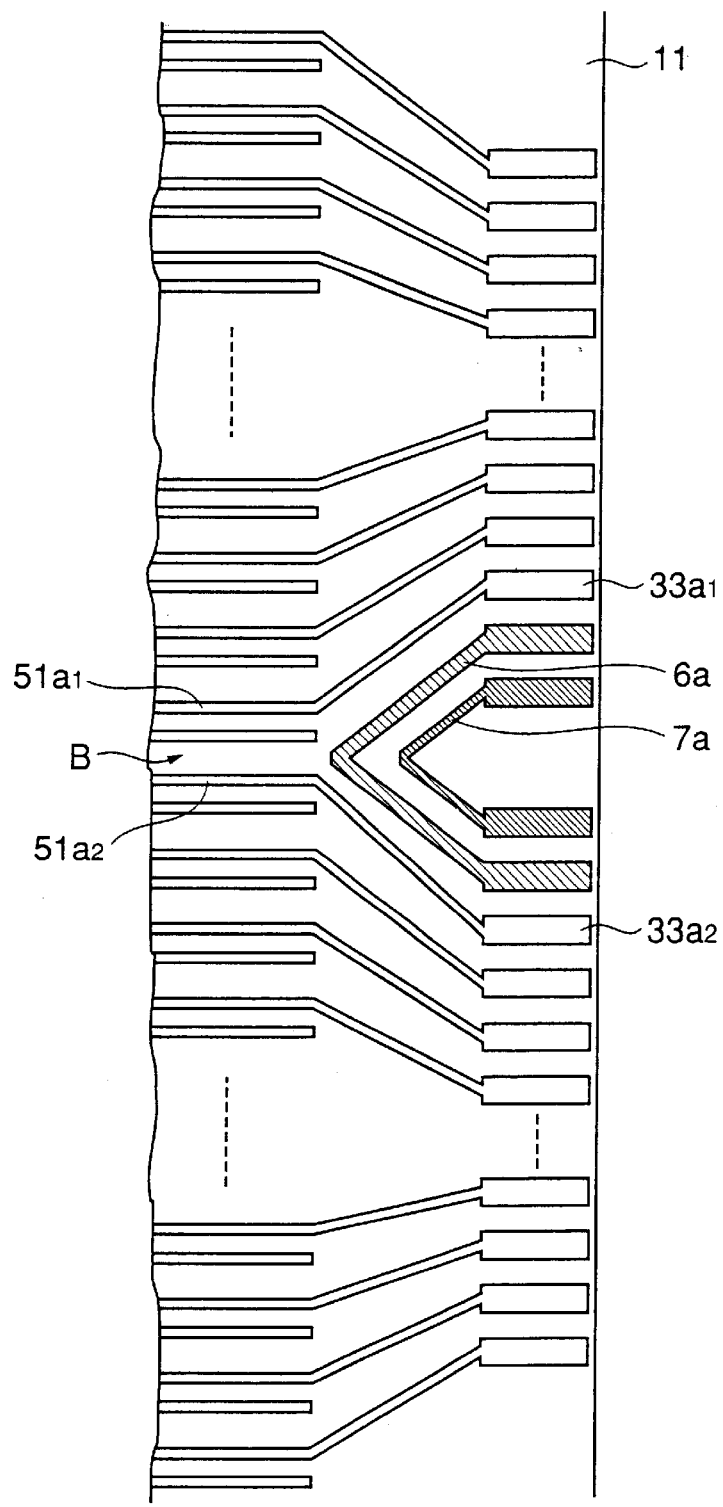
FIG. 8 is a view illustrating a third variant in which the width of the resist pattern for forming a dummy electrode is changed according to the embodiment.

FIG. 8 is a view illustrating a third variant in which the width of the resist pattern for dummy electrode formation is changed.

In the present example, the resist pattern for dummy electrode formation is constituted by two resist patterns, that is, a resist pattern $6a$ having a greater width than that of the resist pattern for the other electrodes and a resist pattern $7a$ having the same width as that of the resist pattern for the other electrodes. In FIG. 8, the resist pattern $6a$ having a greater width is provided on a downstream side in the direction of the flow of the etching solvent (in the direction shown in the arrow F of FIG. 3). However, this arrangement is not a limitative one. The resist pattern having a greater widths may be provided on an upstream side. Moreover, as required, three or more resist patterns may be provided, their widths may be changed and the combination of a wider resist pattern and a narrower resist pattern may be varied, optionally.

By this constituting the resist pattern for dummy electrode formation of the resist pattern $6a$ having a greater width than that of the resist pattern for the other electrodes and a resist pattern $7a$ having the same width as that of the resist pattern for the other electrodes, it is possible to obtain almost intermediate advantages between the case in which two resist patterns $6a$ having greater widths than that of the resist pattern for the other electrodes are provided and the case in which two resist patterns 7a having the same width the same as that of the resist pattern for the other electrodes are provided.

Figure 9:
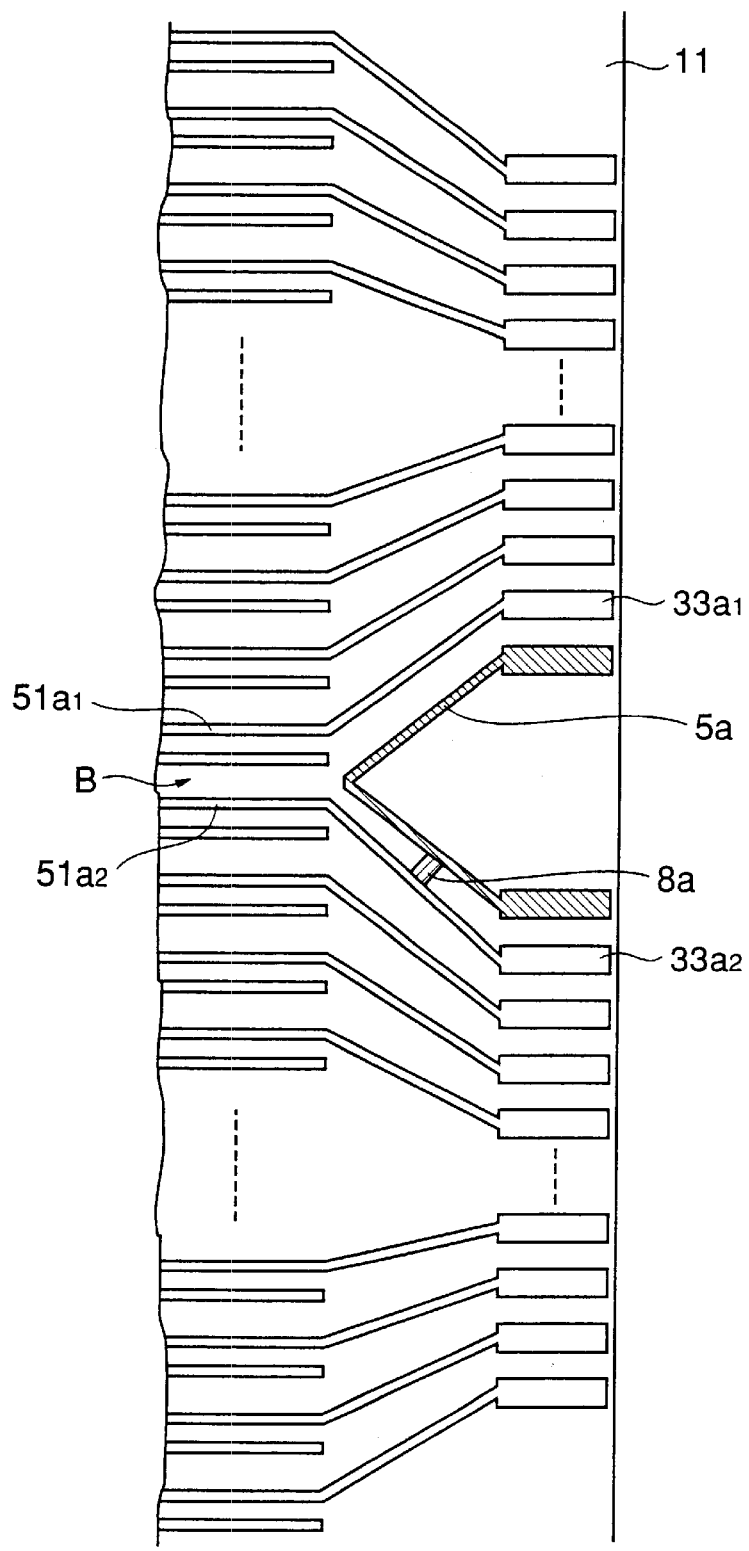
FIG. 9 is a view illustrating an example in which a resist pattern for forming a coupling portion to couple the dummy electrode to a lead electrode portion is provided according to an embodiment.

FIG. 9 is a view illustrating an example in which a resist pattern for forming a coupling portion to couple a dummy electrode to a lead electrode portion is provided.

Figure 10:
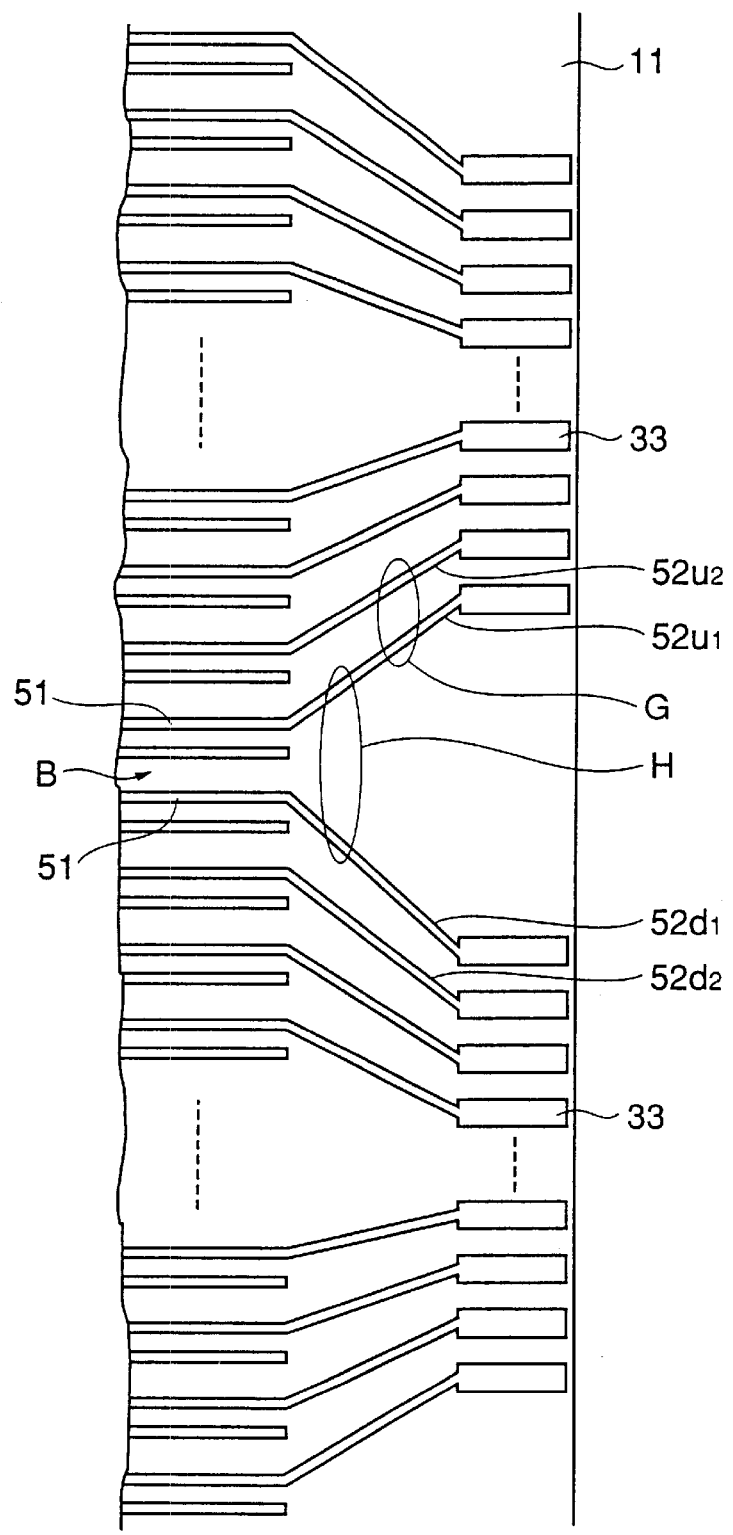
FIG. 10 is a view illustrating a difference in coupling capacity values of the lead electrode portions.

In the present example, a resist pattern 5a for dummy electrode formation is provided and a resist pattern 8a for forming a coupling portion is provided, thereby forming the coupling portion for coupling the lead electrode portion to the dummy electrode.

Where the oblique lead electrode portions are provided, a coupling capacity value of the electrode is changed in the block boundary portion B. As shown in FIG. 10, all the electrodes are parallel with each other in discharge electrode portions 51. Therefore, the coupling capacity generated between adjacent electrodes is almost equal in all the electrodes. In the lead electrode portions 52, however, the coupling capacity generated between adjacent electrodes is varied depending on whether the electrodes are in the block boundary portion B or not.

More specifically, a coupling capacity G generated between a lead electrode portion $52u_1$ and a lead electrode portion $52u_2$ positioned thereabove has a different value from that of a coupling capacity H generated between the lead electrode portion $52u_1$ and a lead electrode portion $52d_1$ positioned thereunder. Accordingly, it is supposed that this variation in the coupling capacity is one of the causes of display unevenness in the block boundary portion B.

In order to eliminate the above-mentioned drawback, a coupling portion 8 is provided to couple the dummy electrode 5 to the lead electrode portion $52d_1$ as shown in FIG. 11. With such coupling, the coupling capacity G generated between the lead electrode portion $52u_1$ and the lead electrode portion $52u_2$ positioned thereabove has almost the same value as that of a coupling capacity I generated between the lead electrode portion $52u_1$ and the lead electrode portion $52d_1$ positioned thereunder. Moreover, the coupling capacity generated between the lead electrode portion $52d_1$ and the lead electrode portion $52u_1$ positioned thereabove has almost the same value as that of the coupling capacity generated between the lead electrode portion $52d_1$ and a lead electrode portion $52d_2$ positioned thereunder.

By thus providing, the resist pattern 8a for forming the coupling portion together with the resist pattern 5a for dummy electrode formation during the formation of the electrode and thereby coupling the dummy electrode 5 to the lead electrode portion $52d_1$, the coupling capacity in the lead electrode portions 52 is almost equal in all the electrodes. Therefore, a display panel having uniform electrical characteristics can be obtained.

It is desirable that the coupling portion 8 should be always provided when the dummy electrode 5 is formed. In the case in which a plurality of dummy electrodes are formed, the resist pattern 8a for forming a coupling portion is provided such that the dummy electrode on the most downstream side is coupled to the lead electrode portion $52d_1$.

The dummy electrode 5 provided by the resist pattern 5a for dummy electrode formation and the coupling portion 8 provided by the resist pattern 8a for forming the coupling portion remain on the finished PDP in the same manner as other electrodes.

Consequently, it is possible to obtain both the effect of restricting the flow of the etching solvent into the block boundary portion and the effect of making the coupling capacity uniform and thereby eliminating display unevenness during the driving operation of the finished PDP.

Although the dummy electrode 5 is coupled to the lead electrode portion $52d_1$ provided under the dummy electrode 5 through the coupling portion 8 in the above-described example, the dummy electrode 5 may be coupled to the lead electrode portion $52u_1$ provided above the dummy electrode 5. The coupling portion 8 may be formed in any position where it does not disturb display. It is desirable that the coupling portion 8 should have such a sufficient width as to impede the etching solvent getting thereover.

By thus forming the resist pattern for dummy electrode formation, the shape of the electrodes can be made uniform during the manufacture of the PDP. More specifically, the flow of the etching solvent into the block boundary portion can be limited and electrode edges in contact with a gap between the electrodes formed continuously to the block boundary portion can be prevented from being excessively etched. Consequently, electrodes having a uniform dimension can be formed and display unevenness in the direction of the electrodes can be prevented from being generated on the finished display panel.

Moreover, the coupling capacity between the electrodes is made equal, so that the electrical characteristics can be made uniform. More specifically, the coupling portion is formed to couple the dummy electrode to the lead electrode portion. Consequently, the coupling capacity of the lead electrode portions is made almost equal in all the electrodes. Thus, it is possible to obtain a display panel having uniform electrical characteristics.

In the case in which the terminals are fetched to the substrate ends on both sides as in the embodiment of the present invention and in FIG. 12 (conventional art), the resist pattern for dummy electrode formation may also be provided on an outlet side of the substrate from which the etching solvent flows out, in order to prevent the width of electrodes from being increased due to a reduction in the flow velocity of the liquid in the vicinity of the outlet side. The dummy electrode is desirably provided on the outlet side also for making the coupling capacity uniform.

Although the description has been given to the examples in which the display electrodes X and Y are formed on the substrate 11 on the front face side, the address electrode A can be formed on the substrate 21 on the back face side in the same manner.

Numerous modifications and alternative embodiments of the present invention will be apparent to those skilled in the art in view of the foregoing description. Accordingly, this description is to be construed as illustrative only, and is provided for the purpose of teaching those skilled in the art the best mode of carrying out the 1 invention. The details of the structure and/or function may be varied substantially without departing from the spirit of the invention and all modifications which come within the scope of the appended claims are reserved.

What is claimed is:

1. An electrode structure of a display panel, comprising:
   a plurality of electrodes formed on a substrate constituting the display panel, the electrodes including display electrode portions provided in almost parallel in a central part of the substrate and oblique lead electrode portions converged in a predetermined number for each block from the display electrode portions to reach terminal portions at an end of the substrate;
   a dummy electrode provided between two oblique lead electrode portions extending in different directions in a block boundary portion, to limit a flow of an etching solvent into the block boundary portion during etching when the electrodes are formed; and a coupling portion to couple the dummy electrode to at least one of the oblique lead electrode portions formed on the same substrate.

2. The electrode structure according to claim 1, wherein the dummy electrode is of an almost V-shaped configuration, formed along the two oblique lead electrode portions extending in different directions in the block boundary portion.

3. The electrode structure according to claim 1, wherein the width of the dummy electrode is larger than that of the electrodes.

4. The electrode structure according to claim 2, wherein the width of the dummy electrode is larger than that of the electrodes.

5. The electrode structure according to claim 1, wherein the dummy electrode comprises a plurality of electrodes arranged in the direction of the flow of the etching solvent.

6. The electrode structure according to claim 2, wherein the dummy electrode comprises a plurality of electrodes arranged in the direction of the flow of the etching solvent.

7. An electrode structure of a display panel, comprising:

a plurality of electrodes formed on a substrate constituting the display panel, the electrodes including display electrode portions provided in almost parallel in a central part of the substrate and oblique lead electrode portions converged in a predetermined number for each block from the display electrode portions to reach terminal portions at an end of the substrate;

a dummy electrode provided between two oblique lead electrode portions extending in different directions in a block boundary portion, the dummy electrode being in parallel to each of the two oblique lead electrode portions; and a coupling portion to couple the dummy electrode to at least one of the oblique lead electrode portions.

8. The electrode structure according to claim 7, wherein the dummy electrode is an almost V-shaped electrode formed along the two oblique lead electrode portions extending in different directions in the block boundary portion.

9. The electrode structure according to claim 8, wherein the width of the dummy electrode is larger than that of the electrodes.

10. The electrode structure according to claim 7, wherein the width of the dummy electrode is larger than that of the electrodes.

11. The electrode structure according to claim 7, wherein the dummy electrode and the coupling portion are formed of the same material as the electrode material at the same time when the electrodes are formed.

12. A method of manufacturing a display panel having a plurality of display electrodes including electrode portions provided at an equal pitch and electrode terminal portions provided partially at an unequal pitch on an substrate, comprising:

forming an electrode material layer on the substrate;

forming a resist film corresponding to a pattern of the display electrodes to be formed on the electrode material layer and also a resist film corresponding to a pattern of a dummy electrode to limit a flow of an etching solvent into a region where the pitch of the electrode terminal portion is large and a pattern of a coupling portion to couple the dummy electrode to at least one of the electrode terminal portions, wherein the resist film corresponding to the pattern of the dummy electrode to limit the flow of the etching solvent comprises a plurality of resist patterns arranged in the direction of the flow of the etching solvent; and carrying out etching.

13. A method of forming electrodes of a display panel, comprising:

forming an electrode material layer on a substrate;

forming a resist pattern to form a plurality of display electrodes including display electrode portions arranged in almost parallel on a central part of the substrate and oblique lead electrode portions converged in a predetermined number for each block from the display electrode portions to reach terminal portions at an end of the substrate;

simultaneously forming a resist pattern to form a dummy electrode and a coupling portion, the dummy electrode being to limit a flow of an etching solvent into a block boundary portion between traces of the resist patterns to form the electrodes whose traces correspond to two oblique lead electrode portions extending in different directions in the block boundary portion, the coupling portion being to couple the dummy electrode to at least one of the two oblique lead electrode portions, wherein the resist pattern to form the dummy electrode to limit the flow of the etching solvent comprises a plurality of resist patterns arranged in the direction of the flow of the etching solvent; and carrying out etching to form the electrodes.

14. The method according to claim 13, wherein the resist pattern to form the dummy electrode to limit the flow of the etching solvent is an almost V-shaped pattern formed along the traces of the resist pattern corresponding to the two oblique lead electrodes extending in different directions in the block boundary portion.

15. The method according to claim 14, wherein the width of the resist pattern to form the dummy electrode to limit the flow of the etching solvent is larger than that of the resist pattern to form the electrodes.

16. The method according to claim 13, wherein the width of the resist pattern to form the dummy electrode to form the flow of the etching solvent is larger than that of the resist pattern to form the electrodes.

* * * * *